United States Patent
Watanabe et al.

(10) Patent No.: US 8,687,374 B2
(45) Date of Patent: Apr. 1, 2014

(54) ELECTRONIC CONTROLLER FOR VEHICLE

(75) Inventors: Hirofumi Watanabe, Isesaki (JP);
Kazuhiko Nakano, Isesaki (JP);
Daisuke Yasukawa, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 221 days.

(21) Appl. No.: 13/052,620

(22) Filed: Mar. 21, 2011

(65) Prior Publication Data

US 2011/0235289 A1    Sep. 29, 2011

(30) Foreign Application Priority Data

Mar. 24, 2010 (JP) .................. 2010-068344

(51) Int. Cl.
*H05K 5/00* (2006.01)
*H05K 7/00* (2006.01)

(52) U.S. Cl.
USPC .......................................................... 361/752

(58) Field of Classification Search
None
See application file for complete search history.

(56) References Cited

U.S. PATENT DOCUMENTS

| | | | |
|---|---|---|---|
| 5,886,869 A * | 3/1999 | Fussell et al. | 361/679.31 |
| 6,469,896 B2 | 10/2002 | Jocham | |
| 6,561,421 B1 * | 5/2003 | Yu | 235/451 |
| 6,778,401 B1 * | 8/2004 | Yu et al. | 361/752 |
| 6,792,487 B2 * | 9/2004 | Kao | 710/74 |
| 6,873,524 B2 * | 3/2005 | Kaczeus et al. | 361/679.33 |
| 7,035,110 B1 * | 4/2006 | Wang et al. | 361/737 |
| 7,249,978 B1 * | 7/2007 | Ni | 439/660 |
| 7,405,928 B2 * | 7/2008 | Robertson et al. | 361/679.33 |
| 7,744,381 B2 | 6/2010 | Honda | |
| 7,755,907 B2 * | 7/2010 | Inagaki | 361/752 |
| 2001/0003503 A1 | 6/2001 | Jocham | |
| 2007/0103857 A1 * | 5/2007 | Weech et al. | 361/683 |
| 2008/0045061 A1 | 2/2008 | Hayashi | |
| 2009/0068862 A1 | 3/2009 | Honda | |

FOREIGN PATENT DOCUMENTS

| | | |
|---|---|---|
| EP | 1 806 960 A1 | 7/2007 |
| JP | 2001-168545 A | 6/2001 |
| JP | 2001-177280 A | 6/2001 |
| JP | 2003-063325 A | 3/2003 |
| JP | 2007-184428 A | 7/2007 |
| JP | 2007-235013 A | 9/2007 |
| JP | 2008-047432 A | 2/2008 |
| JP | 2009-070855 A | 4/2009 |

* cited by examiner

*Primary Examiner* — Jinhee Lee
*Assistant Examiner* — Xanthia C Cunningham
(74) *Attorney, Agent, or Firm* — Foley & Lardner LLP

(57) ABSTRACT

An electronic controller for a vehicle includes a box-shaped frame having only one opened side that has a notch portion into which an electric connector whose connection port protrudes toward an outside fits and a cover that closes an opening of the frame, in which while a groove filled with a sealant is provided at least on a bonded surface of an electric connector to which the cover is bonded, a first convex portion that fits into the groove is provided in a circumferential portion of the cover. Moreover, the electric connector has a flange portion opposite to an inner wall of the frame around the notch portion, and the flange portion is provided with a second convex portion protruding toward the inner wall to surround the notch portion.

8 Claims, 9 Drawing Sheets

ELECTRONIC CONTROLLER FOR VEHICLE

BACKGROUND OF THE INVENTION

1. Field of the Invention

The present invention relates to an electronic controller for a vehicle.

2. Description of Related Art

An electronic controller mounted on a vehicle has a structure in which a board is housed inside a box-shaped frame having an opening, the electric connector is fixed in a state in which a connection port of the electric connector for electric connection to the board protrudes out of the frame, and the opening of the frame is closed with a cover.

In order to ensure sealing properties of the electronic controller, a technology to apply a sealant to a bonded surface on which the cover is bonded to the frame and the electric connector is proposed.

However, if the frame or the electric connector is bonded while an end face of the cover is exposed, a foreign matter is more likely to get between the cover and the frame or the electric connector to lift an edge of the cover, and the edge rises from the frame or the electric connector when the cover is deformed. Thus, there is a possibility that water infiltrates through a gap caused by the rise to corrode the board housed inside the frame.

SUMMARY OF THE INVENTION

In the present invention, an electronic controller for a vehicle includes a board on which electronic components are mounted, an electric connector electrically connected to the board, a box-shaped frame having only one opened side that houses the board and has a notch portion into which the electric connector fits in a state in which a connection port thereof protrudes toward an outside, and a cover that closes an opening of the frame, in which a groove filled with a sealant is formed at least on a bonded surface of the electric connector to which the cover is bonded. In a circumferential portion of the cover, on the other hand, a convex portion fitting into the groove is formed.

The other objects and features of this invention will become understood from the following description with reference to the accompanying drawings.

DESCRIPTION OF THE PREFERRED EMBODIMENT

Figure 1:
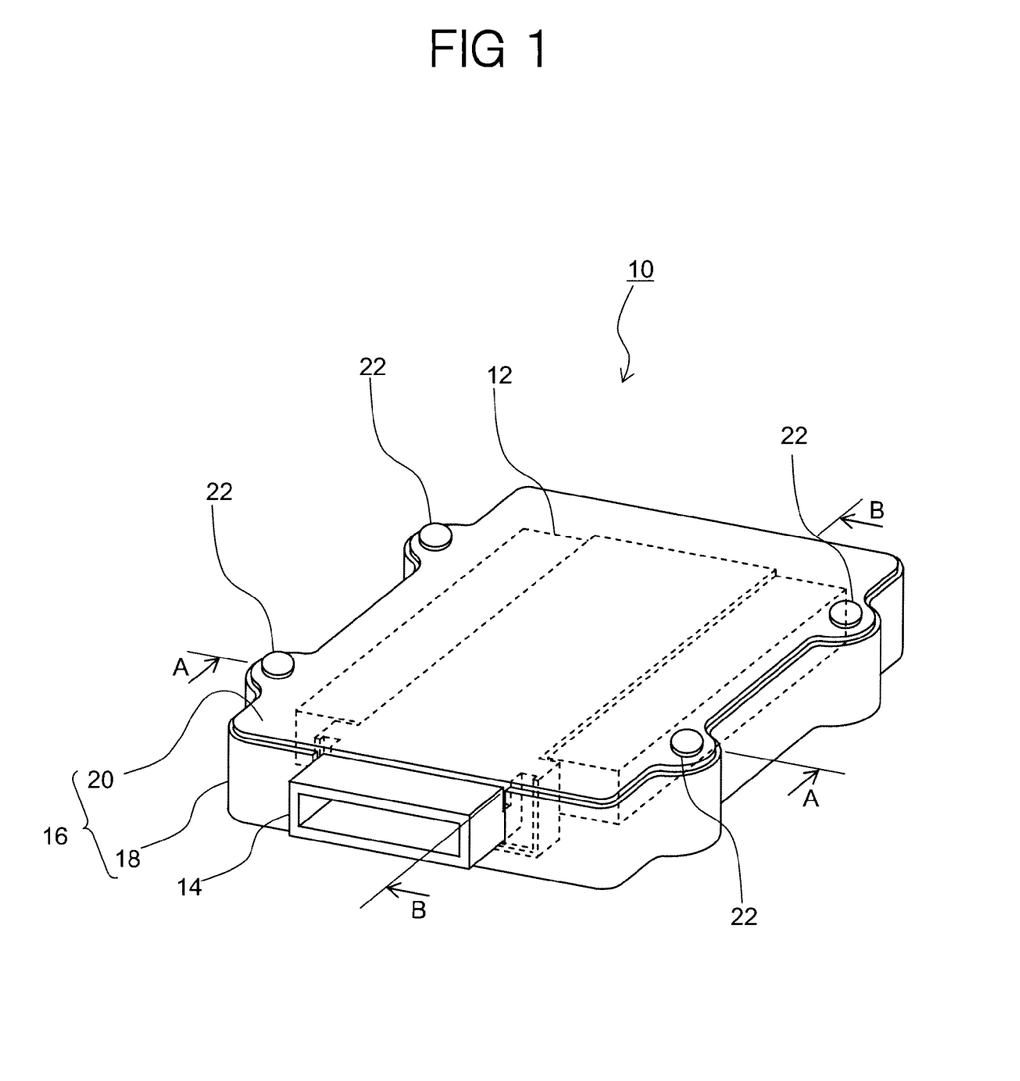
FIG. 1 is a perspective view illustrating an example of an electronic controller for a vehicle.
Figure 2:
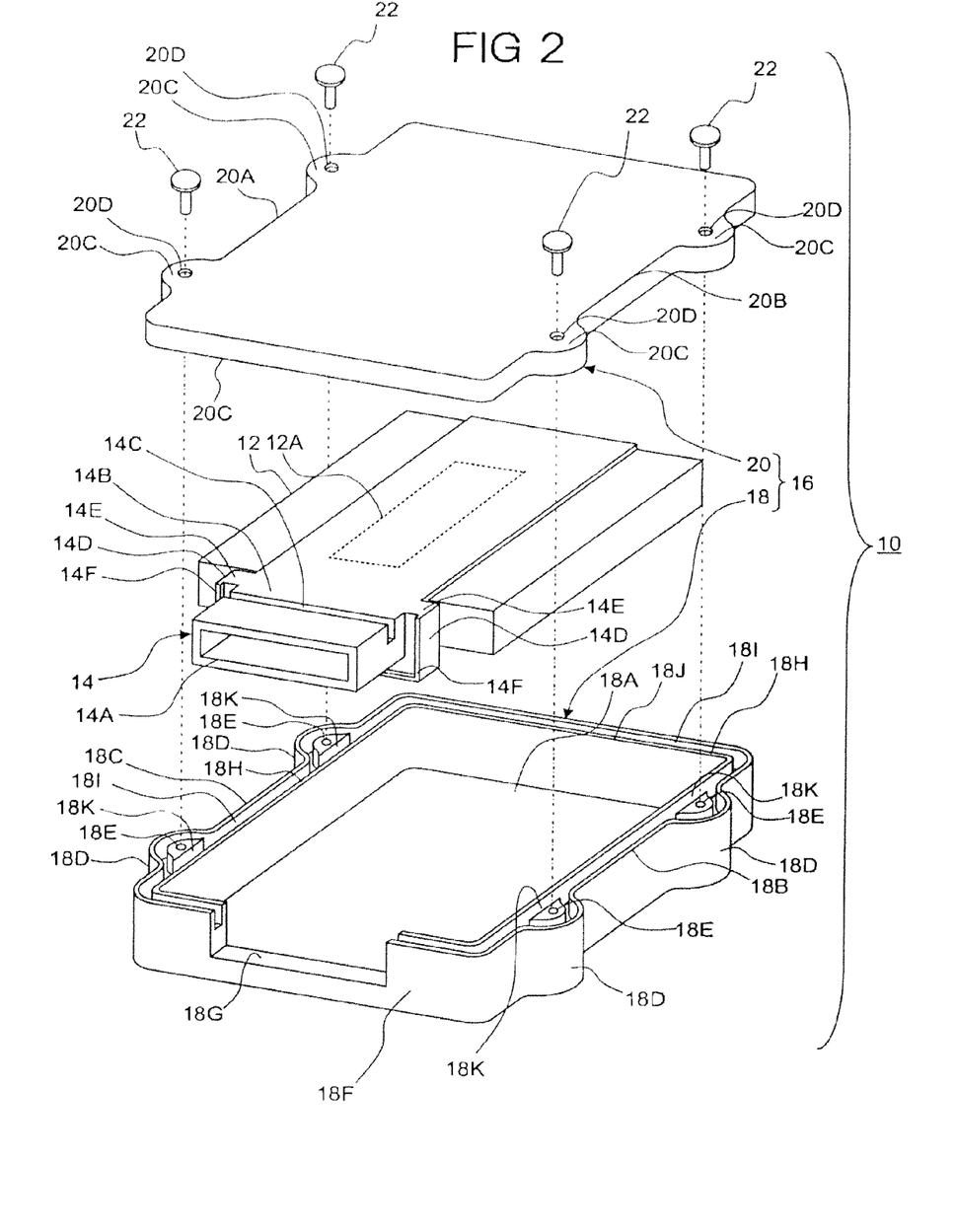
FIG. 2 is an exploded perspective view illustrating the electronic controller for vehicle in FIG. 1.

FIGS. 1 and 2 illustrates an example of an electronic controller for a vehicle (hereinafter, referred to as an "electronic controller").

An electronic controller 10 includes a resin-molded board 12, on which an electronic component 12A is mounted, to which an electric connector 14 electrically connected, and a housing 16 to house the resin molded board 12 therein.

Resin-molded board 12 is obtained by integrally forming circuits (not illustrated) electrically connected and having various functions by molding using a thermosetting resin such as a polybuthylene terephthalate (PBT) resin.

Examples of circuits having various functions include, for example, a control circuit including a microcomputer or arithmetic processing unit that calculates a manipulated variable of an actuator, a drive circuit including semiconductor elements such as a power transistor, and a noise filter circuit including a capacitor and relay.

Though not illustrated, resin-molded board 12 is fixed to a predetermined position inside a frame 18 using, for example, screws as fastening members.

Electric connector 14 is integrally formed with resin-molded board 12 by molding and electrically connected to circuits inside resin-mold board 12.

Housing 16 includes box-shaped frame 18 having only one opened side and a plane-shaped cover 20 that closes an opening 18A of frame 18.

Frame 18 has an outer shape of a substantial rectangle with round corners in a plane view and has two boss portions 18D in a substantially semicircular column shape protruding toward the outside of frame 18 from perimeters of both ends of each of two sides 18B and 18C opposite to each other.

In boss portion 18D, a female screw 18E to fasten cover 20 by using a male screw 22 as an example of the fastening member is formed.

Frame 18 has one notch portion 18G on a surface 18F without boss portion 18D and when resin-molded board 12 is fixed to the predetermined position inside frame 18, electric connector 14 is fitted to notch portion 18G in a state in which a connection port 14A thereof protrudes toward the outside of frame 18.

Cover 20 has an outer shape of a substantial rectangle with round corners in a plane view and also has two tabs 20C in a substantially semicircular plate shape protruding toward the outside of cover 20 from perimeters of both ends of each of two sides 20A and 20B opposite to each other to face boss portions 18D of frame 18.

Each of tabs 20C has an insertion hole 20D through which a male screw 22 is penetrated. Cover 20 is fixed to frame 18 by male screw 22 being penetrated through insertion hole 20D and screwed into female screw 18E formed in boss portion 18D of frame 18.

Incidentally, boss portion 18D, notch portion 18G, and tab 20C are not limited to the configuration in FIGS. 1 and 2.

Though not illustrated, for example, boss portions 18D are provided on one outer surface having notch portion 18G, and boss portions 18D may be positioned on both sides of notch portion 18G and also two boss portions 18D may be provided on the outer surface on the opposite side of the outer surface on which notch portion 18G is formed. In this case, tabs 20C in a substantially semicircular plate shape protruding toward the outside of cover 20 may be provided to face boss portions 18D.

Though not illustrated, for example, a configuration in which tab 20C is not provided may be adopted by forming boss portions 18D inside opening 18A of frame 18 and forming insertion hole 20D through which male screw 22 screwed into female screw 18E of boss portion 18D is penetrated in cover 20.

Accordingly, electronic controller 10 mounted on a vehicle may be configured in accordance with the layout of vehicle forming components therearound and the shape of resin-molded board 12 housed in housing 16.

Frame 18 and cover 20 are each produced by using an alloy having, for example, aluminum (Al), magnesium (Mg), and iron (Fe) as main components and by, for example, casting, pressing, cutting or a combination thereof. Accordingly, noise on the board inside resin-molded board 12 can be suppressed and thermal conductivity from resin-molded board 12 can be enhanced.

A groove 14C filled with a sealant S is recessed on a bonded surface 14B of electric connector 14 bonded to cover 20. As the sealant S, for example, an adhesive resin having sealing properties such as a heat curing resin, ultraviolet curing resin, anaerobic curing resin, and moisture curing resin is used. Cover 20 and electric connector 14 are bonded in a state in which resin-molded board 12 is fixed to the predetermined position inside frame 18 (hereinafter, referred to as a "fixed state") and also in a state in which opening 18A of frame 18 is closed with cover 20 (hereinafter, referred to as a "closed state").

A groove 18I filled with the sealant S is recessed on a bonded surface 18H of frame 18 bonded to cover 20 in the closed state.

Figure 3:
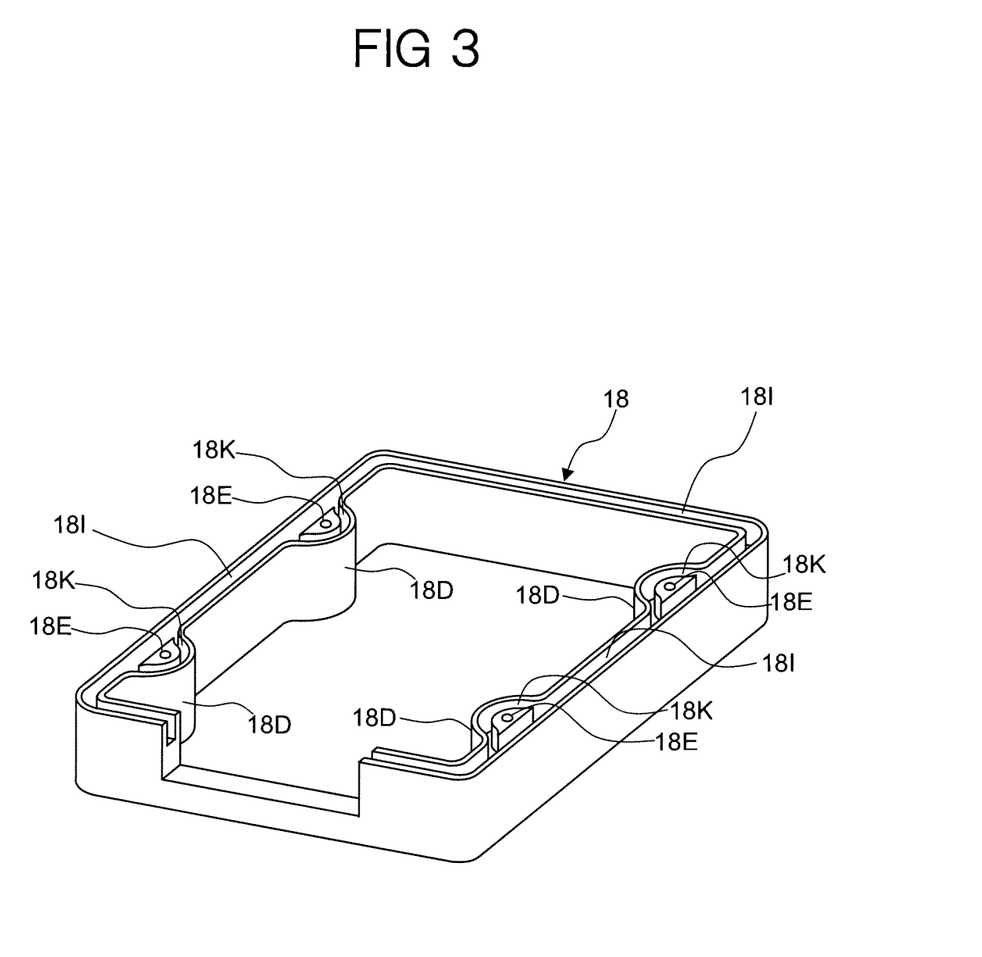
FIG. 3 is a perspective view illustrating another embodiment of a frame.

In the vicinity of female screw 18E of frame 18, in addition to groove 18I formed between female screw 18E and a circumference of boss portions 18D, an auxiliary groove 18K whose one end is branched from groove 18I to pass between an opening 18J of frame 18 and female screw 18E and whose the other end is merged again with groove 18I is formed to surround female screw 18E together with groove 18I. If, as illustrated in FIG. 3, boss portions 18D are formed in opening 18A of frame 18, the configuration is different from the above configuration. That is, in the vicinity of female screw 18E of frame 18, while groove 18I is formed between the circumference of frame 18 and female screw 18E, auxiliary groove 18K whose one end is branched from groove 18I to pass between the circumference of boss portions 18D and female screw 18E and whose the other end is merged again with groove 18I is formed to surround female screw 18E together with groove 18I.

Figure 4:
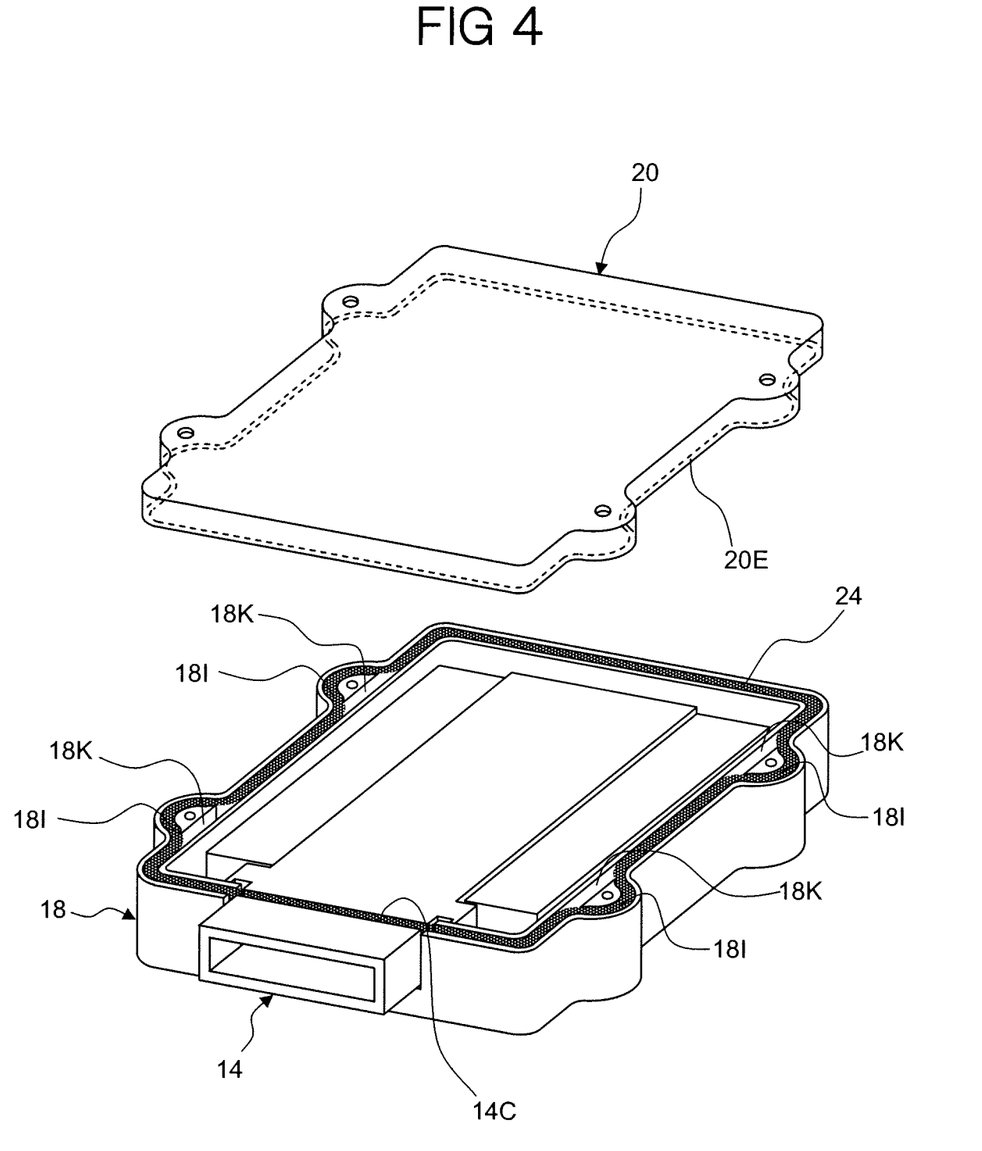
FIG. 4 is a perspective view illustrating a circumferential groove.

As illustrated in FIG. 4, the groove 14C and groove 18I are connected to form a circumferential groove 24.

Cover 20 has a rib-shaped convex portion 20E all around circumferential portions thereof and convex portion 20E fits into circumferential groove 24 filled with the sealant S in a closed state.

In the "circumferential groove", there is a step or a gap on an inner-groove surface in a boundary between groove 18I of frame 18 and groove 14C of electric connector 14, in this case, a groove as described below may be acceptable. That is, a groove formed by connecting each groove to such an extent that convex portion 20E of cover 20 can be fitted into groove 14C and groove 18I filled with the sealant S and sealing properties can be ensured between frame 18 and electric connector 14 and cover 20, may be acceptable.

Figure 5:
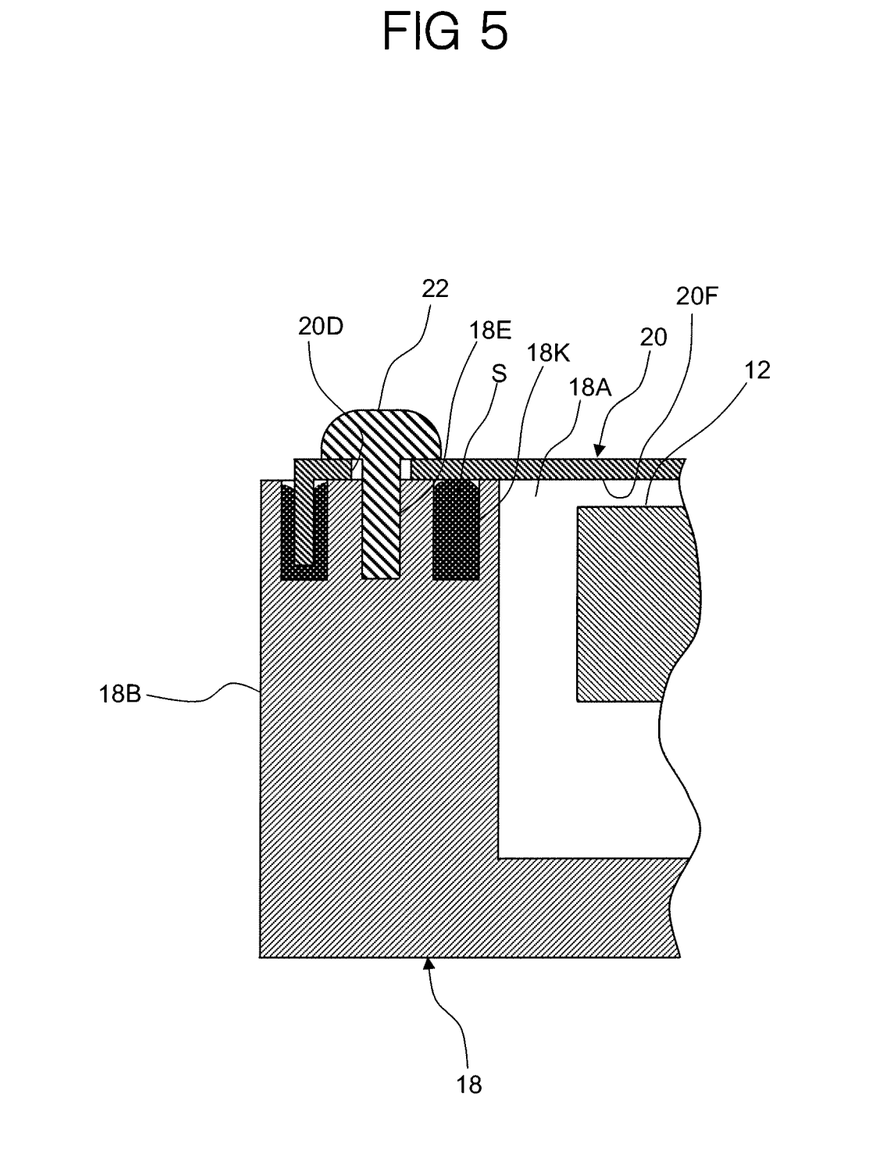
FIG. 5 is a partial sectional view (A-A section in FIG. 1) illustrating a sealed state of a screw fastening portion.

As illustrated in FIG. 5 (A-A section in FIG. 1), in the fixed state and the closed state, the sealant S filled in auxiliary groove 18K is in contact with a rear face 20F, which is a surface of cover 20 opposite to resin-molded board 12. Accordingly, infiltration of moisture into opening 18A of frame 18 through a gap between male screw 22 and insertion hole 20D can be suppressed, so that sealing properties between cover 20 and frame 18 can further be enhanced. Though not illustrated, cover 20 may further include convex portion 20E fitted into auxiliary groove 18K and in this case, cover 20 is produced by, for example, casting.

Figure 6:
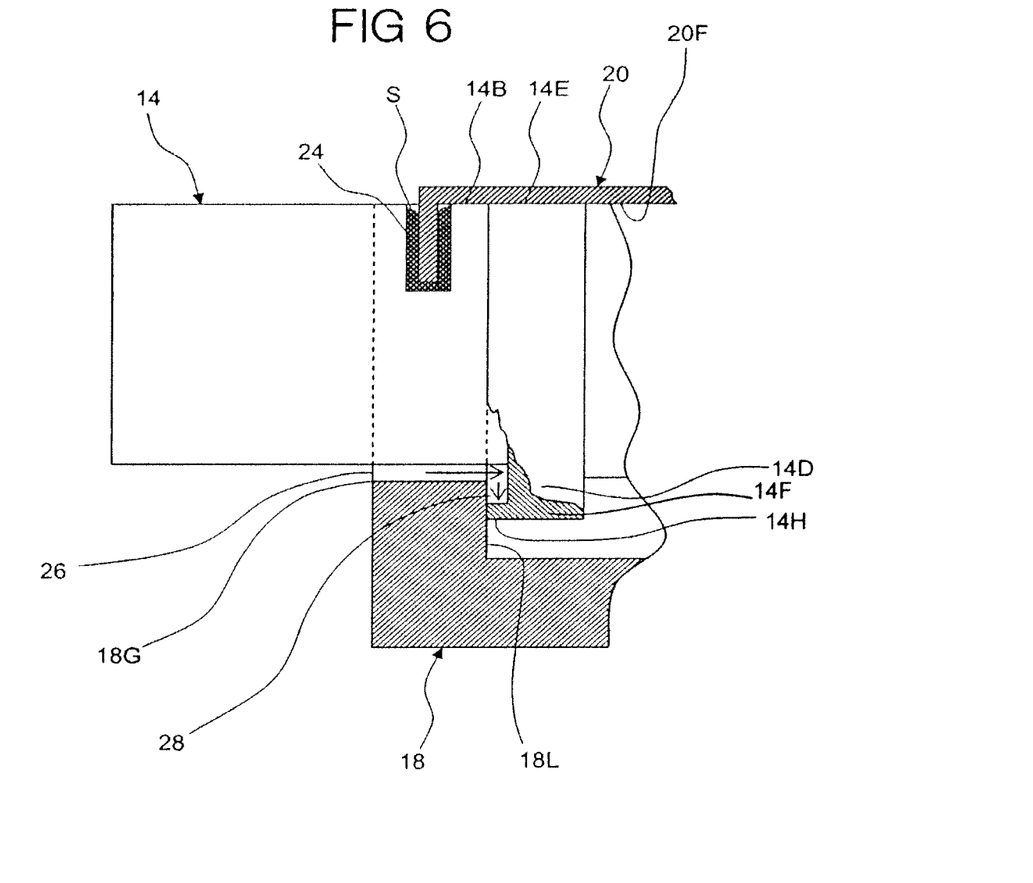
FIG. 6 is a partial sectional view (B-B section in FIG. 1) illustrating a flange portion of an electric connector, a convex portion thereof, and a flow of the sealant.

As illustrated in FIG. 6 (B-B section in FIG. 1), electric connector 14 includes a flange portion 14D opposite to an inner wall 18L of frame 18 around notch portion 18G in the fixed state.

Flange portion 14D does not protrude in the direction of cover 20 from bonded surface 14B and an opposite surface 14E opposite to cover 20 of flange portion 14D and bonded surface 14B of electric connector 14 are flush with each other. That is, opposite surface 14E and bonded surface 14B are formed in the same plane. Then, bonded surface 14B and opposite surface 14E is contact with rear face 20F of cover 20.

Flange portion 14D is provided with a convex portion 14F protruding toward inner wall 18L of frame 18 to surround notch portion 18G. The tip 14H of convex portion 14F is positioned in contact with inner wall 18L or with a spacing therebetween in the fixed state.

In order to ensure sealing properties between electric connector 14 and frame 18, a gap 26 between electric connector 14 and an end face of notch portion 18G is also filled with the sealant S.

Figure 7:
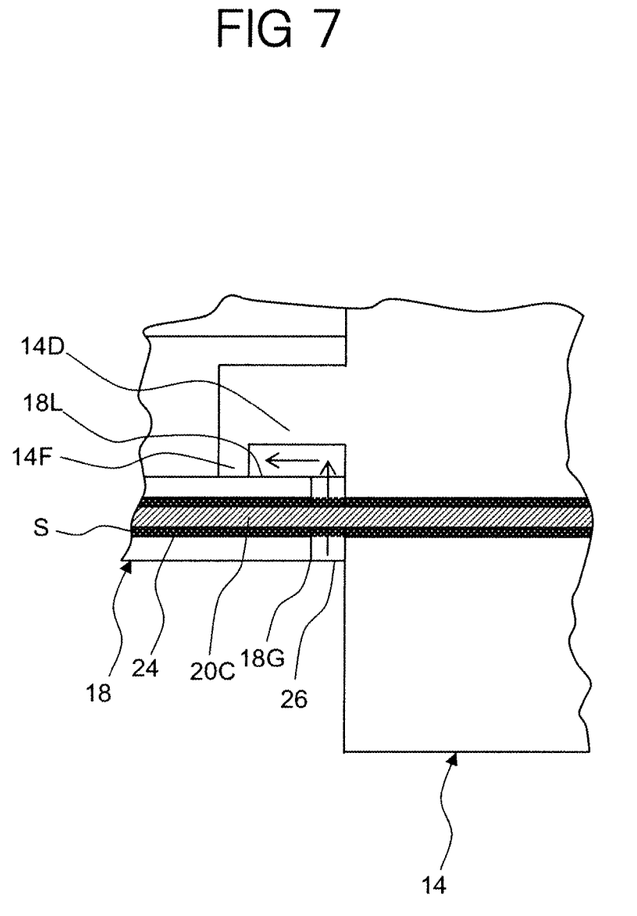
FIG. 7 is a partial sectional view illustrating the flow of the sealant.

A portion of the sealant S with which gap 26 is filled runs into flange portion 14D and then flows through a channel between flange portion 14D and inner wall 18L before being blocked by convex portion 14F as shown by arrows. If viewed in a partial sectional view (FIG. 7) in which electronic controller 10 in FIG. 1 is cut by a plane including bonded surface 18H, the flow of the sealant S is as indicated by arrows.

Figure 8:
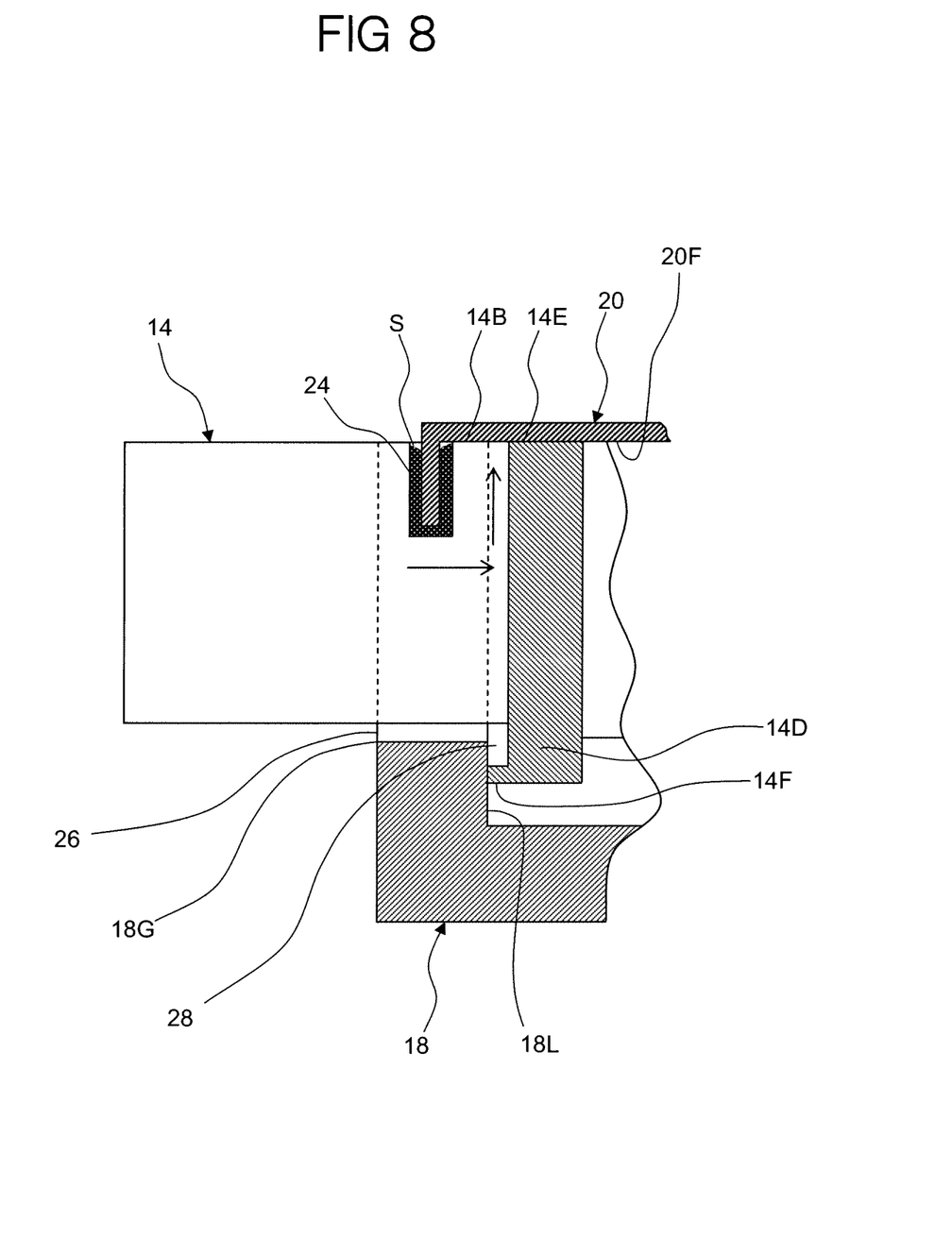
FIG. 8 is a partial sectional view illustrating the flow of the sealant.

Also, as illustrated in FIG. 8 (B-B section in FIG. 1), another portion of the sealant S runs into flange portion 14D and then blocked by rear face 20F of cover 20.

Furthermore, still another portion of the sealant S is merged with the sealant S with which circumferential groove 24 is filled.

Therefore, the sealant S filled from gap 26 is retained in a sealant retention space (hereinafter, referred to as a "retention space") 28 formed by flange portion 14D, convex portion 14F, inner wall 18L, a base of flange portion 14D, and cover 20.

According to the electronic controller 10 described above, convex portion 20E of cover 20 fits into circumferential groove 24 filled with the sealant S and the end face of cover 20 is submerged in the sealant S and thus, the rise of cover 20 can also be suppressed in the case described below. That is, if, for example, a vehicle is driven with electronic controller 10 mounted in an engine room or the like, moisture containing sea water or a snow melting agent (for example, calcium chloride) may attach to electronic controller 10. If the end face of the cover is exposed, moisture containing salt content or the like described above infiltrates into a gap between a cover edge and the electric connector or frame and dries to gradually crystallize components. Then, after repeated infiltration and drying, a crystal may gradually be accumulated to raise the cover edge. Moreover, there might be a possibility that the cover edge is raised when, for example, some external force is applied to the cover edge in vehicle maintenance work.

According to electronic controller 10, however, convex portion 20E of cover 20 fits into circumferential groove 24 filled with the sealant S and the end face of cover 20 is submerged in the sealant S and thus, the rise of cover 20 can be suppressed to ensure water resistance of electronic controller 10. Moreover, such a rise is suppressed, and thus the number of male screws 22 used to fasten cover 20 to frame 18 can be reduced, so that product costs can be made cheaper.

Furthermore, retention space 28 is formed by flange portion 14D and convex portion 14F of electric connector 14, and the sealant S filled from gap 26 is blocked and retained by convex portion 14F and thus, leakage into frame 18 can be suppressed before the sealant S being cured.

In electronic controller 10 described above, as long as cover 20 is in contact with bonded surface 14B and opposite surface 14E, cover 20 as a whole may not be formed in a plate shape.

For example, excluding bonded surface 14B and opposite surface 14E, cover 20 may be caused to protrude in the direction of an opening of frame 18.

In electronic controller 10 described above, while a control circuit is mounted on a printed board, circuits other than the control circuit such as a drive circuit and noise filter circuit may be integrally formed as resin-molded board 12. In this case, the printed board may be arranged between resin-molded board 12 and cover 20. Considering the fact that cover 20 is used as a surface of the retention space forming surfaces that form retention space 28, the printed board may be arranged as described below to reduce leakage of the sealant S in the direction of cover 20. That is, excluding a portion of cover 20 in contact with at least bonded surface 14B and opposite surface 14E, cover 20 is caused to protrude in the direction of the opening of frame 18. In addition, or as another method, a double-level shape in which the surface opposite to cover 20 of resin-molded board 12 is more separated from cover 20 than the surface opposite to cover 20 of electric connector 14 is formed. Accordingly, a space is formed between resin-molded board 12 and cover 20, and the printed board may be arranged in this space.

The printed board is electrically connected to a bus bar extended from the drive circuit inside resin-molded board 12 by welding or soldering.

There is no need for electric connector 14 to be formed integrally with resin-molded board 12, and may be soldered or welded to the board or bus bar as a separate component. Alternatively, electric connector 14 may be connected to the board or bus bar via a lead wire as a separate component. When electric connector 14 is connected via a lead wire, electric connector 14 is separately fixed to frame 18 by fitting into notch portion 18G in a state in which connection port 14A thereof protrudes toward the outside of frame 18.

In electronic controller 10 described above, cover 20 is used as a surface of retention space forming surfaces that form retention space 28.

Figure 9:
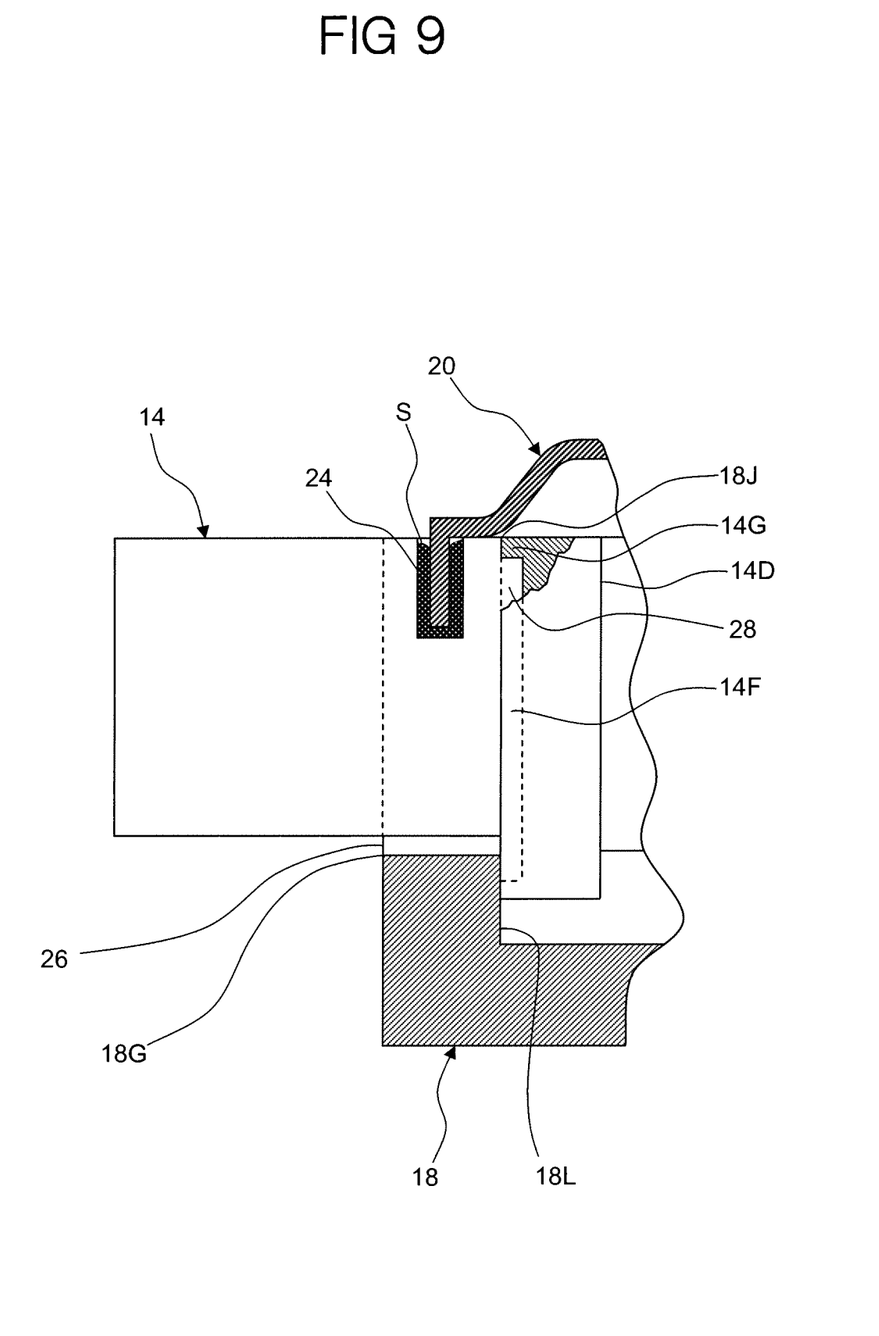
FIG. 9 is a partial sectional view illustrating an extended convex portion.

However, if cover 20 cannot be used as a retention space forming surface (if, for example, the printed board is arranged between cover 20 and resin-molded board 12), a step described below may be taken. That is, as illustrated in FIG. 9, an extended convex portion 14G extending in substantially the same plane as opening 18J of frame 18 or the vicinity thereof from convex portion 14F in flange portion 14D may be formed. Accordingly, retention space 28 can be formed without using cover 20, and the sealant S filled from gap 26 can suppress leakage to between cover 20 and electric connector 14.

Electronic controller 10 described above can also be applied as a control unit of a brake controller using an electric motor as an actuator and a power steering apparatus.

Electric connector 14 may also be applied when a connection port thereof protrudes from an opening or notch portion formed on one surface of a fixed object such as an on-vehicle electric component and fixed. In this case, electric connector 14 may include a flange portion opposite to a surrounding surface of surroundings of the opening or notch portion on a non-protrusion side of the fixed object on which no connection port protrudes, and the flange portion is provided with a convex portion which protrudes toward the surrounding surface on the non-protrusion side to surround the opening or notch portion. Accordingly, a space similar to retention space 28 described above is formed. According to the above electric connector 14, the sealant S is blocked by the convex portion, and leakage from the space similar to retention space 28 into surroundings thereof can be suppressed before the sealant S being cured.

The entire contents of Japanese Patent Application No. 2010-068344 filed on Mar. 24, 2010, a priority of which is claimed, are incorporated herein by reference.

While only a select embodiment has been chosen to illustrate and describe the present invention, it will be apparent to those skilled in the art from this disclosure that various changes and modifications can be made herein without departing from the scope of the invention as defined in the appended claims.

Furthermore, the foregoing description of the embodiment according to the present invention is provided for illustration only, and not for the purpose of limiting the invention, the invention as claimed in the appended claims and their equivalents.

What is claimed is:

1. An electronic controller for a vehicle comprising:
   a board on which an electronic component is mounted;
   an electric connector electrically connected to the board;
   a box-shaped frame having only one side, the frame housing the hoard and having a notch portion into which the electric connector fits in a state in which a connection port thereof protrudes toward an outside; and
   a cover that closes an opening of the frame,
   wherein
      a groove is formed on a bonded surface of the electric connector to which the cover is bonded when the board and the electric connector are fixed to the frame, so as to be tilled with a sealant,
      a first convex portion is formed in a circumferential portion of the cover so as to fit into the groove,
      the electric connector has at least a flange portion opposite to an inner wall of the frame around the notch portion, and the flange portion is provided with a second convex portion protruding toward the inner wall to surround the notch portion, and
      an extended convex portion extending in substantially an identical plane to the opening of the frame from the second convex portion is formed in the flange portion of the electric connector.

2. An electronic controller for a vehicle comprising: a board on which an electronic
   component is mounted;
   an electric connector electrically connected to the hoard;
   a box-shaped frame having only one open side, the frame housing the board and having a notch portion into which the electric connector fits in a state in which a connection port thereof protrudes to ward an outside ; and
   a cover that c loses an opening of the frame,
   wherein
      a circumferential groove is formed on a bonded surface of the frame to which the cover is bonded and on a bonded surface of the electric connector to which the cover is bonded when the board and the electric connector are fixed to the frame, so as to be tilled with a sealant, a first convex portion is formed in a circumferential portion all around the cover so as to lit into the circumferential groove, and the frame has boss portions protruding to an outside thereof and in which female screw threads to fasten the cover are provided in the bossed portions such that the circumferential groove passes between the female screw thread and a circumference o f the female screw thread's respective boss portion.

3. The electronic controller for a vehicle according to claim 2, wherein an auxiliary groove whose one end is branched from the circumferential groove to pass between the opening of the frame and the female screw thread and whose other end is merged again with the circumferential groove is formed to surround the female screw thread together with the circumferential groove, and the auxiliary groove is filled with the sealant.

4. The electronic controller for a vehicle according to claim 2, wherein the electric connector has at least a flange portion opposite to an inner wall of the frame around the notch portion, and the flange portion is provided with a second convex portion protruding toward the inner wall to surround the notch portion.

5. The electronic controller for a vehicle according to claim 4, wherein a tip of the second convex portion is in contact with the inner wall, 6. The electronic controller for a vehicle according to claim 4. wherein a tip of the second convex portion is positioned with a spacing from the inner wall.

7. The electronic controller for a vehicle according to claim 4, wherein an opposite surface opposite to the cover of the flange portion and the bonded Surface which the cover is bonded are formed in a same plane in the electric connector. and the opposite surface and the bonded surface are in contact with a rear face of the cover.

8. The electronic controller for a vehicle according to claim 4, wherein an extended convex portion extending in substantially an identical plane to the opening of the frame from the second convex portion is formed.

* * * * *